(12) United States Patent  (10) Patent No.: US 9,169,845 B2
Takeuchi et al.  (45) Date of Patent: Oct. 27, 2015

(54) FAN PLATE

(71) Applicant: Western Digital Technologies, Inc., Irvine, CA (US)

(72) Inventors: Kevin M. Takeuchi, Tustin, CA (US); Bruce A. Cariker, Diamond Bar, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 221 days.

(21) Appl. No.: 13/951,387

(22) Filed: Jul. 25, 2013

(65) Prior Publication Data

US 2014/0369002 A1   Dec. 18, 2014

Related U.S. Application Data

(60) Provisional application No. 61/836,612, filed on Jun. 18, 2013.

(51) Int. Cl.
| | | |
|---|---|---|
| F04D 29/58 | (2006.01) | |
| F04D 25/06 | (2006.01) | |
| F04D 29/60 | (2006.01) | |
| H05K 7/20 | (2006.01) | |
| G06F 1/20 | (2006.01) | |

(52) U.S. Cl.
CPC .......... F04D 25/0613 (2013.01); F04D 29/582 (2013.01); F04D 29/601 (2013.01)

(58) Field of Classification Search
CPC .......... H05K 7/20; H05K 5/00; F04D 29/584; F04D 29/602; F04D 29/64; F04D 25/12; G06F 1/20
USPC ............. 361/679.31, 679.47, 679.48, 679.49, 361/679.5, 690, 694, 695, 831; 165/80.2, 165/80.3, 104.33, 121–126; 312/223.2, 312/326; 415/213.1, 223, 177, 178, 108; 417/423.14, 360, 423.5; 454/184
See application file for complete search history.

(56) References Cited

U.S. PATENT DOCUMENTS

| | | | | |
|---|---|---|---|---|
| 5,460,571 | A * | 10/1995 | Kato et al. ..................... | 454/184 |
| 5,586,865 | A * | 12/1996 | Yin ............................ | 415/213.1 |
| 6,435,889 | B1 * | 8/2002 | Vinson et al. ................. | 439/247 |
| 6,462,944 | B1 | 10/2002 | Lin | |
| 6,999,313 | B2 * | 2/2006 | Shih ............................. | 361/695 |
| 7,014,558 | B2 * | 3/2006 | Oh ................................ | 454/184 |
| 7,515,413 | B1 | 4/2009 | Curtis | |

(Continued)

FOREIGN PATENT DOCUMENTS

| | | |
|---|---|---|
| KR | 20-0284122 | 7/2002 |
| KR | 20-0435031 | 1/2007 |

OTHER PUBLICATIONS

International Search Report and Written Opinion dated Oct. 8, 2014 from related PCT Serial No. PCT/US2014/043050, 15 pages.

*Primary Examiner* — Michail V Datskovskiy

(57) ABSTRACT

A fan plate system can include a fan plate and may or may not include the fan. The fan plate can include one or more surfaces. The fan plate can also include a grill configured to allow air to flow into or from a fan through the grill. The one or more surfaces can be configured to connect to a first end of an outer housing of the fan. The one or more surfaces can also provide a gap between the first end of the fan outer housing and the grill when the fan outer housing is connected to the fan plate. In some embodiments, an electronic device can include a fan plate system.

20 Claims, 9 Drawing Sheets

(56) References Cited

U.S. PATENT DOCUMENTS

| | | |
|---|---|---|
| 7,701,705 B1 | 4/2010 | Szeremeta |
| 7,826,224 B2 * | 11/2010 | Sun .............................. 361/697 |
| 7,862,410 B2 * | 1/2011 | McMahan et al. ............ 454/184 |
| 8,064,194 B2 | 11/2011 | Szeremeta |
| 8,113,873 B1 | 2/2012 | Sarraf |
| 8,133,426 B1 | 3/2012 | Yurchenco et al. |
| 8,230,261 B2 | 7/2012 | Calkin |
| 8,341,653 B2 | 12/2012 | Terzis et al. |
| 8,356,976 B2 | 1/2013 | Zhang et al. |
| 8,358,395 B1 | 1/2013 | Szeremeta |
| 8,369,092 B2 | 2/2013 | Atkins et al. |
| 8,417,979 B2 | 4/2013 | Maroney |
| 8,462,460 B1 | 6/2013 | Szeremeta et al. |
| 8,498,088 B1 | 7/2013 | Klein |
| 8,508,939 B2 * | 8/2013 | Takahasi et al. .............. 361/695 |
| 8,547,658 B1 | 10/2013 | Szeremeta |
| 8,570,741 B2 * | 10/2013 | Liu ............... 361/695 |
| 2007/0121290 A1 * | 5/2007 | Chou et al. .................... 361/695 |
| 2007/0292261 A1 | 12/2007 | Tang et al. |
| 2011/0261526 A1 | 10/2011 | Atkins et al. |
| 2012/0170219 A1 * | 7/2012 | Wu et al. ........................ 361/695 |
| 2012/0305745 A1 | 12/2012 | Chen et al. |
| 2012/0325431 A1 | 12/2012 | Xia |
| 2013/0068922 A1 | 3/2013 | Zhou |

* cited by examiner

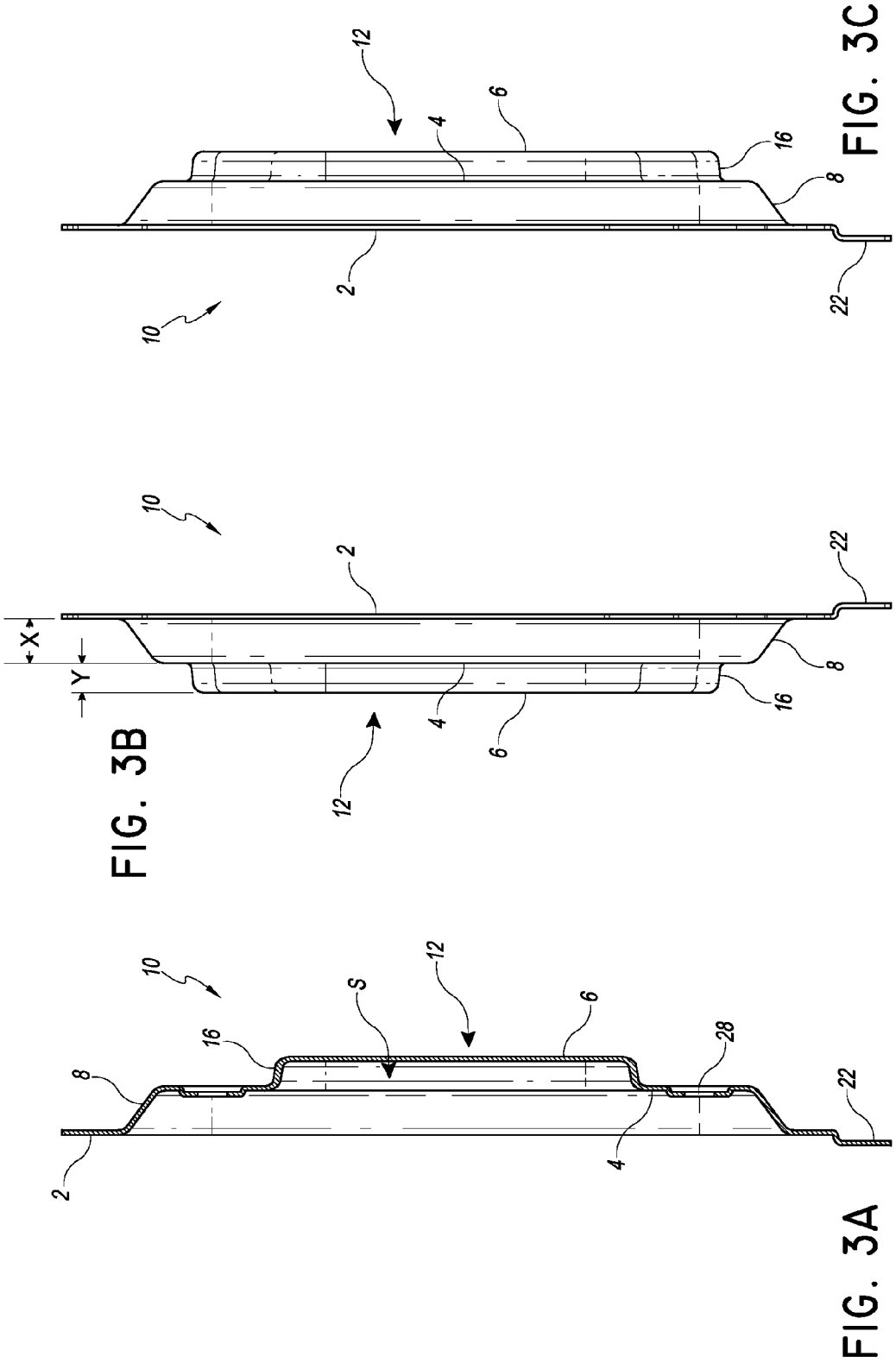

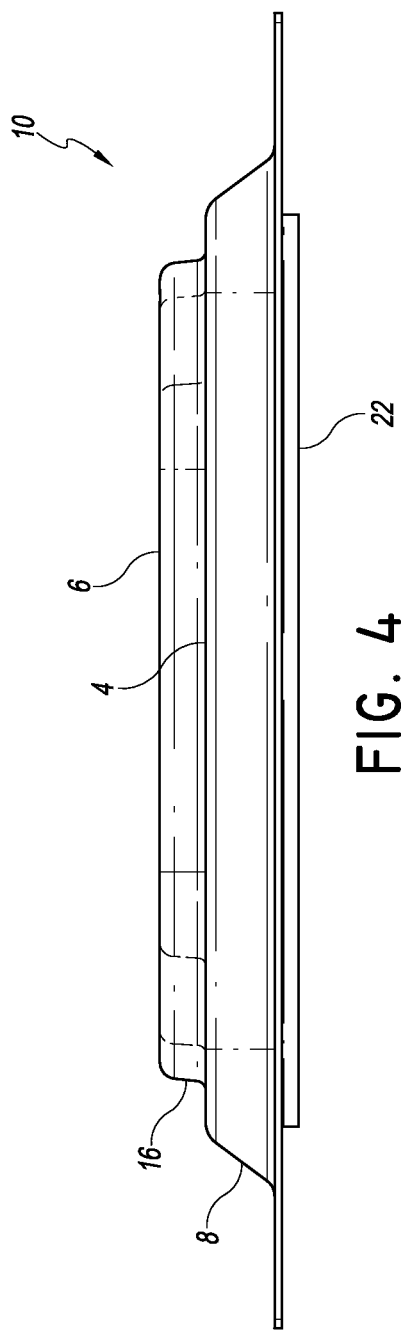
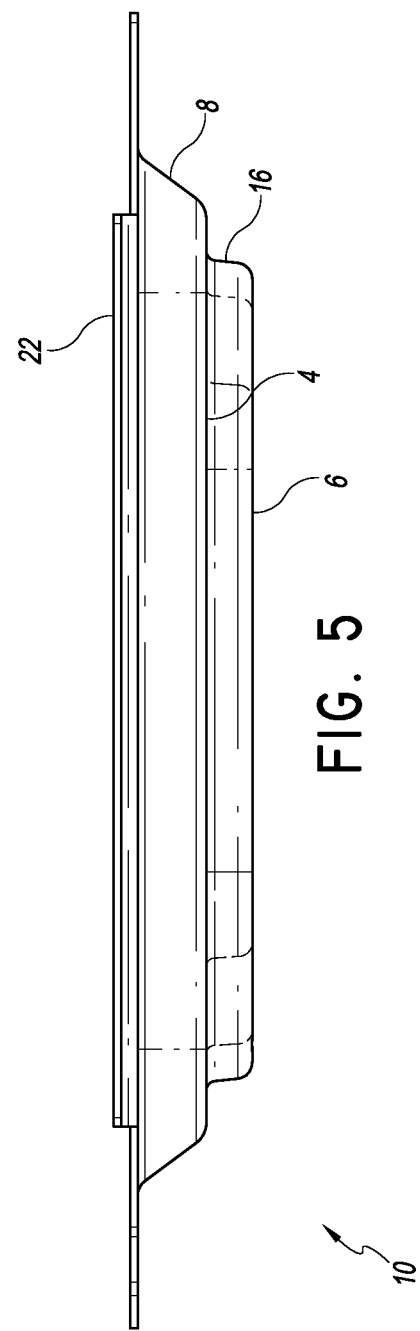

FAN PLATE

CROSS-REFERENCE TO RELATED APPLICATIONS

This application claims priority to U.S. Provisional Application No. 61/836,612, entitled "FAN PLATE," filed on Jun. 18, 2013, which is herein incorporated by reference in its entirety.

BACKGROUND

Various devices include one or more fans for purposes related to air conditioning and air flow. Fans are commonly used to cool components of a device, such as a central processing unit (CPU), graphics card, chipset, hard disk, memory, etc. within a computer. There exists a constant need for improvement in many aspects of fan use with such devices.

BRIEF DESCRIPTION OF THE DRAWINGS

These and other features, aspects and advantages are described below with reference to the drawings, which are intended to illustrate but not to limit the invention. In the drawings, like reference characters denote corresponding features consistently throughout similar embodiments.

FIG. 3A is a cross-sectional view of the plate taken along line 3A-3A of FIG. 2.

FIG. 3B is a first side view of the plate of FIG. 1.

FIG. 3C is a second side view of the plate of FIG. 1 opposite the first side.

FIG. 4 is a top view of the plate of FIG. 1.

FIG. 5 is a bottom view of the plate of FIG. 1.

DETAILED DESCRIPTION

Figure 1:
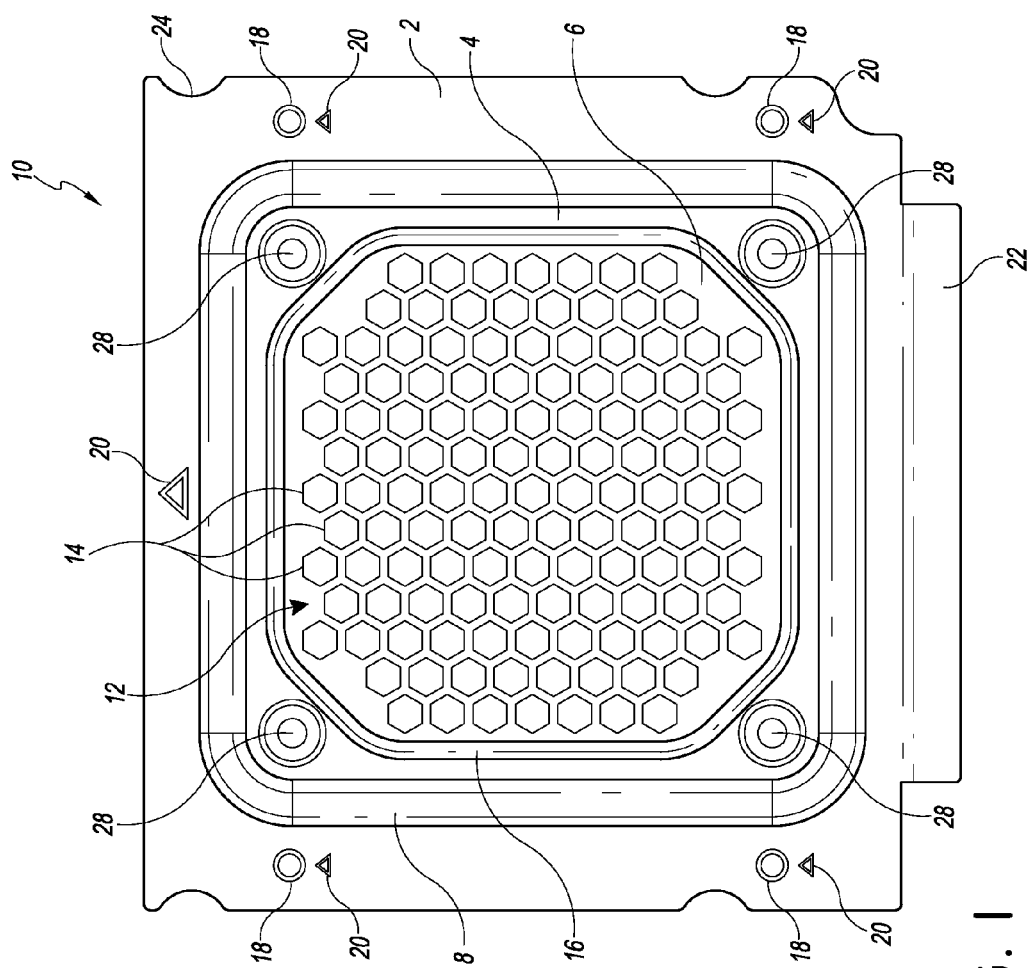
FIG. 1 is a face side of a plate.
Figure 2:
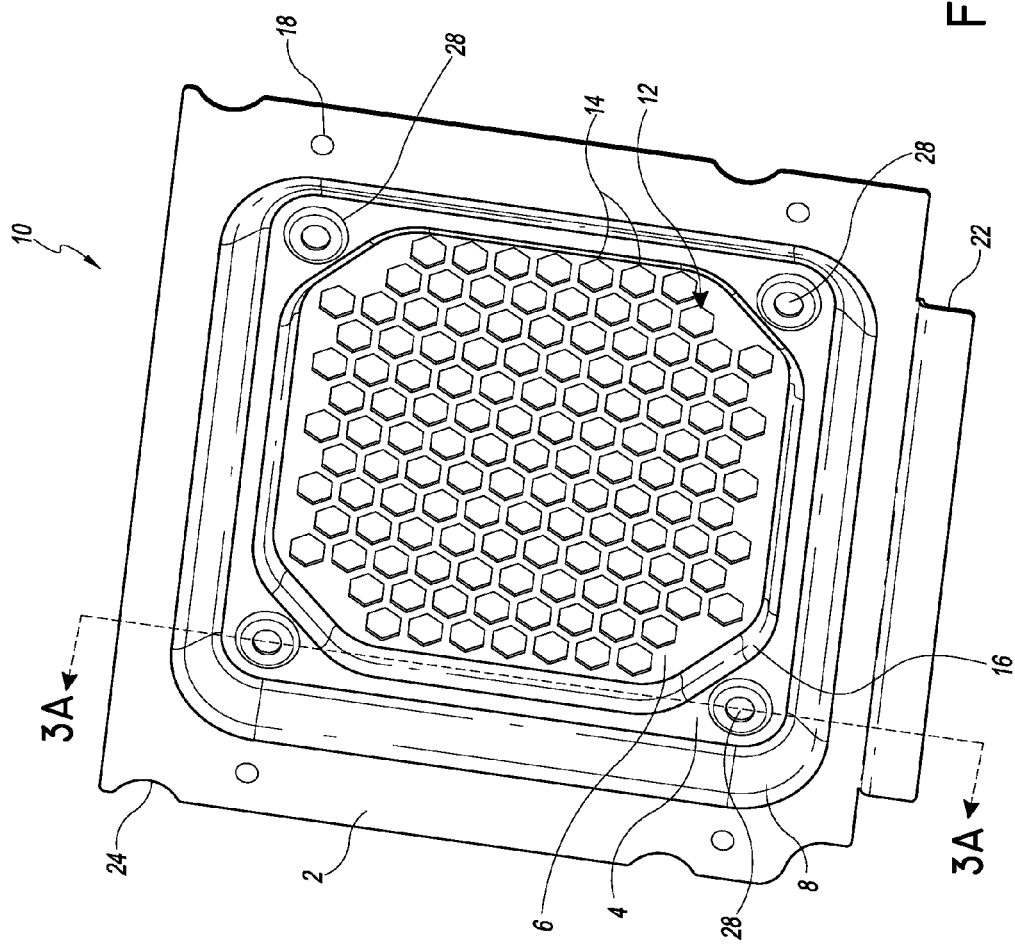
FIG. 2 shows a perspective view of a back side of the plate of FIG. 1.

Certain embodiments disclosed herein relate generally to a plate for holding a fan. The plate can be connected to a chassis, and/or be part of an enclosure, such as a case for a computer, server, hard drive, lighting, or other device having a fan.

A fan plate system according to certain embodiments can include a fan plate and may or may not include the fan. The fan plate can include one or more surfaces. The fan plate can also include a grill configured to allow air to flow into or from a fan through the grill. The one or more surfaces can be configured to connect to a first end of an outer housing of the fan. The one or more surfaces can also provide a gap between the first end of the fan outer housing and the grill when the fan outer housing is connected to the fan plate. In some embodiments, an electronic device can include a fan plate system.

In some embodiments, a fan plate system can comprise a fan and a fan plate. The fan can comprise a plurality of fan blades and an outer housing surrounding the plurality of fan blades. The outer housing may also define a first end of the fan having a first opening and a second end having a second opening, the first end being opposite the second end and the plurality of fan blades positioned between the first opening and the second opening. The fan can be configured such that in use the fan blades can draw air in one of the first and second openings and out the other. The fan plate can comprise a single plate having a plurality of stepped surfaces. The stepped surfaces can comprise a chassis mounting, a fan mounting surface, and a vent surface. The chassis mounting surface can be configured for mounting the fan plate system to a chassis of an electronic device. The fan mounting surface can be spaced from the chassis mounting surface, the first end of the fan outer housing being connected to the fan mounting surface. The vent surface can be spaced from both the fan mounting surface and the chassis mounting surface, such that the space between the fan mounting surface and the vent surface provides a gap between the first end of the fan outer housing and the vent surface. The vent surface can comprise a grill to allow air to flow into or from the first end of the fan through the grill.

According to some embodiments, a fan plate system can include a fan plate and may or may not include the fan. The fan plate can include first, second and third surfaces. The second surface can be spaced from the first surface, the second surface configured to connect to a first end of an outer housing of a fan. The third surface can be spaced from both the first and second surfaces, such that the space between the second surface and the third surface is configured to provide a gap between the first end of the fan outer housing and the third surface when the fan outer housing is connected to the second surface, the third surface comprising a grill configured to allow air to flow into or from the first end of the fan outer housing through the grill.

Various devices include one or more fans for purposes related to air conditioning and air flow. Fans are commonly used to cool components of a device, such as a central processing unit (CPU), graphics card, chipset, hard disk, memory, etc. within a computer. A fan can be used in one of many different devices, such as a computer, server, hard drive, lamp, theatrical lighting, heaters, etc. The device can include a chassis and/or enclosure that may be open, enclosed, or at least partially enclosed. The device may include features such as vents and flow channels to direct and/or control air flow to or from the fan within the device, as well as outside of it.

A fan can be positioned in relation to a plate that can be connected to a chassis, and/or be part of a case or enclosure, such as a case for a computer. In some embodiments, the fan can be connected to the plate. As one example, the plate can be part of a wall of a computer case which may then be a unitary piece of the case, or a separate piece connected to the larger case. In some embodiments, the fan can be connected to a chassis and then a case can enclose at least a portion of the chassis such that a portion of the case is positioned near the fan.

FIGS. 1-6 illustrate one embodiment of a fan plate 10. The fan plate 10 includes a grill 12 with vent holes 14 to allow air to flow to or from a fan. As illustrated, the grill 12 includes a plurality of vent holes 14 in the shape of hexagons to form a honeycomb pattern. The grill 12 provides both structural and functional benefits. The grill 12 provides solid structural rigidity while also allowing enough air flow thru the hole pattern. The grill 12 also protects the fan from foreign objects. In particular, it has been found that a honeycomb pattern provides excellent rigidity while allowing for greater air flow than a pattern of similarly sized circles; though at the same time, it will be understood that the grill 12 can be formed in any number of different configurations. In addition, some fan plates 10 may not have a grill, or the grill may be removable. For example, the fan plate may have one large hole to allow air flow to the fan, but without offering protection against foreign objects.

In some embodiments, a fan plate 10 can be used to provide increased cooling capacity and efficiency while limiting the size of the overall enclosure and/or chassis. A fan plate 10 can be formed with two or more surfaces. As shown in FIGS. 1-6, the fan plate 10 has three surfaces, a chassis mounting surface 2, a first spaced surface 4 and a second spaced surface 6 (or a first surface, a second surface and a third surface). It will be understood that a fan plate may include one, two, three, or more surfaces. The different surfaces may be substantially planar surfaces, or have other shapes and/or configurations. For example, the fan plate can have a single surface that is curved and offers many of the benefits described herein. In some embodiments, the fan plate 10 has multiple stepped surfaces that provide certain advantages (such as thermal and acoustical advantages).

The illustrated first spaced surface 4 is spaced a distance X from the chassis mounting surface 2 (see FIG. 3B) with a first sidewall or first side surface 8 positioned there between. The first spaced surface 4 may be used to mount a fan to the fan plate 10. The second spaced surface 6 is shown spaced a second, longer distance Y from the chassis mounting surface 2 (FIG. 3B) than the first spaced surface 4. A second sidewall or second side surface 16 can be positioned between the second spaced surface 6 and the first spaced surface 4. The sidewalls 8, 16 can be positioned at a number of different angles with respect to the other surfaces and may be angled or straight.

Holes 28 can be provided on the first spaced surface 4 to connect a fan such as with screws, though other connection methods can also be used. As best seen in FIG. 3A, the holes 28 are recessed or countersunk for receiving the head of a screw of other fastener. The illustrated holes also form slight protrusions on the opposite side of the recess.

Having a multi-stepped or varying depth back surface (e.g. a first spaced surface 4 and a second spaced surface 6) to the fan plate 10 can provide many benefits. For example, this can allow the fan to be positioned away from other internal components. Having the fan location extended farther back from the unit can alleviate static pressure in order to provide better cooling air flow out of the unit. Alleviating static pressure in turn reduces the noise levels. This can also allow the overall enclosure to be smaller. For example, the fan and fan plate 10 can extend out slightly from the rest of the enclosure instead of having a longer chassis to provide the desired internal spacing between the fan and the other components. Thus, the fan plate 10 can yield better airflow in a compact design.

The second spaced surface 6 can allow for an air space S between the fan and the grill 12 (FIG. 3A). Increasing the space between the grill 12 and the fan can provide lower acoustic levels (i.e. fan noise). This also reduces the static pressure of the air while also increasing air flow similar to the first spaced surface. In addition, providing space S between the fan and the grill 12 can help reduce the possibility of contact between the fan blades and the grill 12. For example, an out of balance fan may cause the fan blades to extend out past the fan casing. If the grill 12 is positioned directly across the face of the casing without any space, the fan blades may undesirably contact the grill.

The fan plate 10 can be metal and can be made by hydroforming, deep draw process, etc. In other embodiments the fan plate 10 can be made from plastic, such as by injection molding. The illustrated design uses four countersunk holes 18 indicated by triangular symbols 20 for mounting into a chassis (FIG. 1). A triangular symbol 20 at the top of the plate can represent "up" to help properly orient the fan plate for assembly. As shown, the top triangle 20 is larger than the other triangles, though other configurations can also be used.

The fan plate may also be provided with a tongue 22 to allow for hinging of the fan plate 10 and to help assist in locating the plate in the proper place on a chassis or enclosure. The tongue 22 can extend from the chassis mounting surface 2 for aligning the fan plate 10 in a hole in the chassis of an electronic device as will be described in more detail below. This can for example, help ensure that screw holes are properly aligned. The tongue 22 may extend inward and then down from the chassis mounting surface 2. On the perimeter of the fan plate 10, circular cutouts 24 are shown to provide clearance for easy removal from existing cover mounting screws in said locations.

Features of the fan plate 10 shown in the illustrated embodiment of FIGS. 1-6 include: a deep drawn back mounting flange 4 for decreased fan back static pressure for increased air flow out of the system, an increase backside facing drawn surface 6 to decrease acoustical noise during operation, and honeycomb style pattern grill 12 for unique aesthetics, optimal airflow, and structural rigidity, a tongue/step 22 on the bottom of the fan plate for easy hinging and positioning of the fan plate, and arrow styled triangular indicators 20 for screw removal and orientation of the fan plate 10. It will be understood that certain other embodiments may include one or more of these features and/or other features described herein.

According to some embodiments, a fan plate system can include a fan plate and may or may not include the fan. The fan plate can include first, second and third surfaces. The second surface can be spaced from the first surface, the second surface configured to connect to a first end of an outer housing of a fan. The third surface can be spaced from both the first and second surfaces, such that the space between the second surface and the third surface is configured to provide a gap between the first end of the fan outer housing and the third surface when the fan outer housing is connected to the second surface, the third surface comprising a grill configured to allow air to flow into or from the first end of the fan outer housing through the grill.

In some embodiments, the fan plate is a single plate and the first, second, and third surfaces are stepped surfaces of the single plate. These surfaces may be substantially planar surfaces.

In some embodiments, the first surface includes a plurality of mounting holes for fastening the fan plate to a chassis of an electronic device. A tongue may extend from the first surface for aligning the fan plate in a hole in the chassis of the electronic device.

Looking now at FIGS. 7-8, additional features of some embodiments of fan plate will be described. As has been mentioned, in some embodiments a fan 30 can be connected to a fan plate 10. The fan can comprise a plurality of fan blades 40 and an outer housing 42 surrounding the plurality of fan blades. The outer housing 42 may also define a first end of the fan having a first opening and a second end having a second opening, the first end being opposite the second end and the plurality of fan blades 40 positioned between the first opening and the second opening. The fan can be configured such that in use the fan blades can draw air in one of the first and second openings and out the other.

Figure 7:
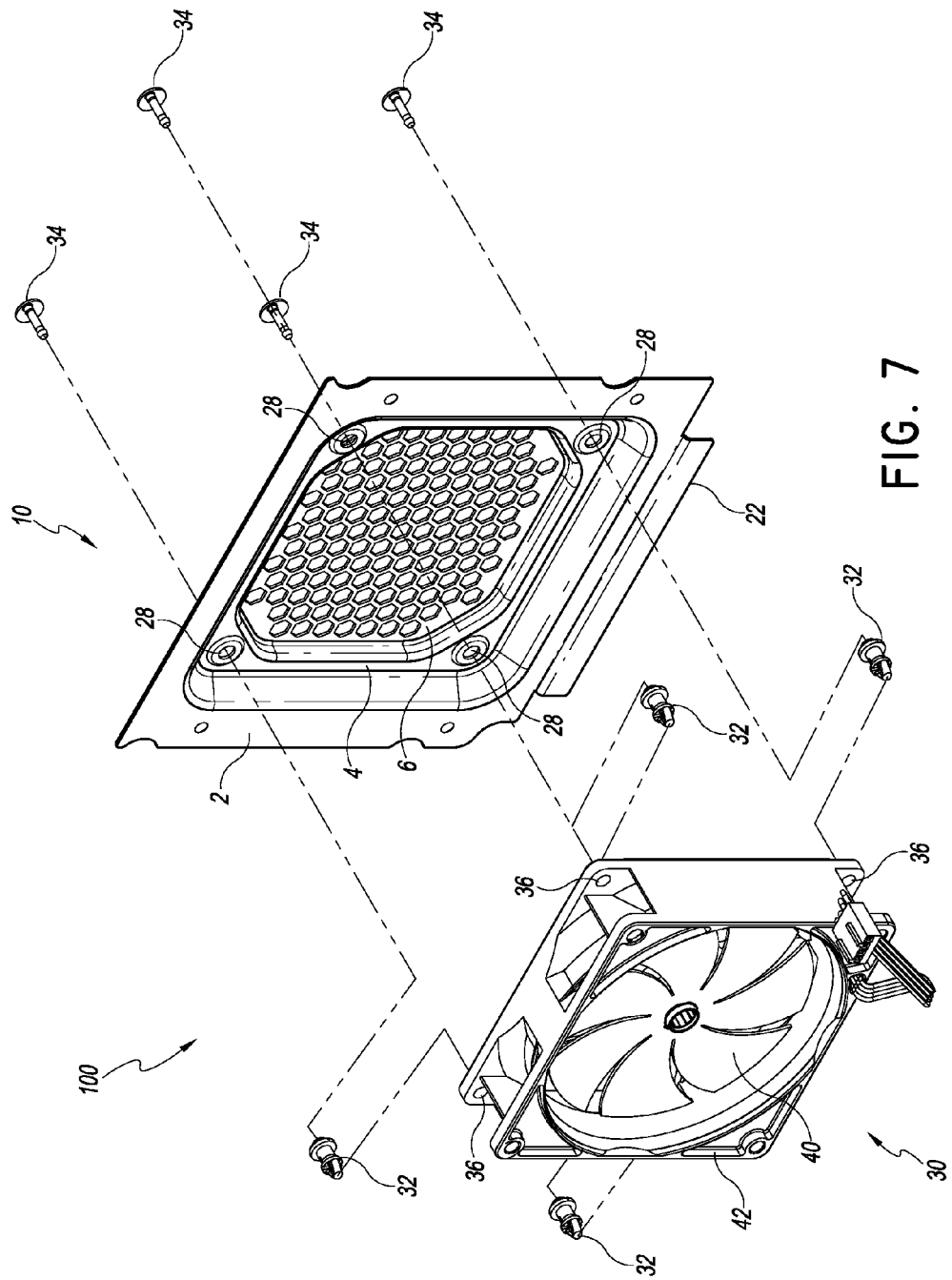
FIG. 7 is an exploded view of a fan plate system.
Figure 8:
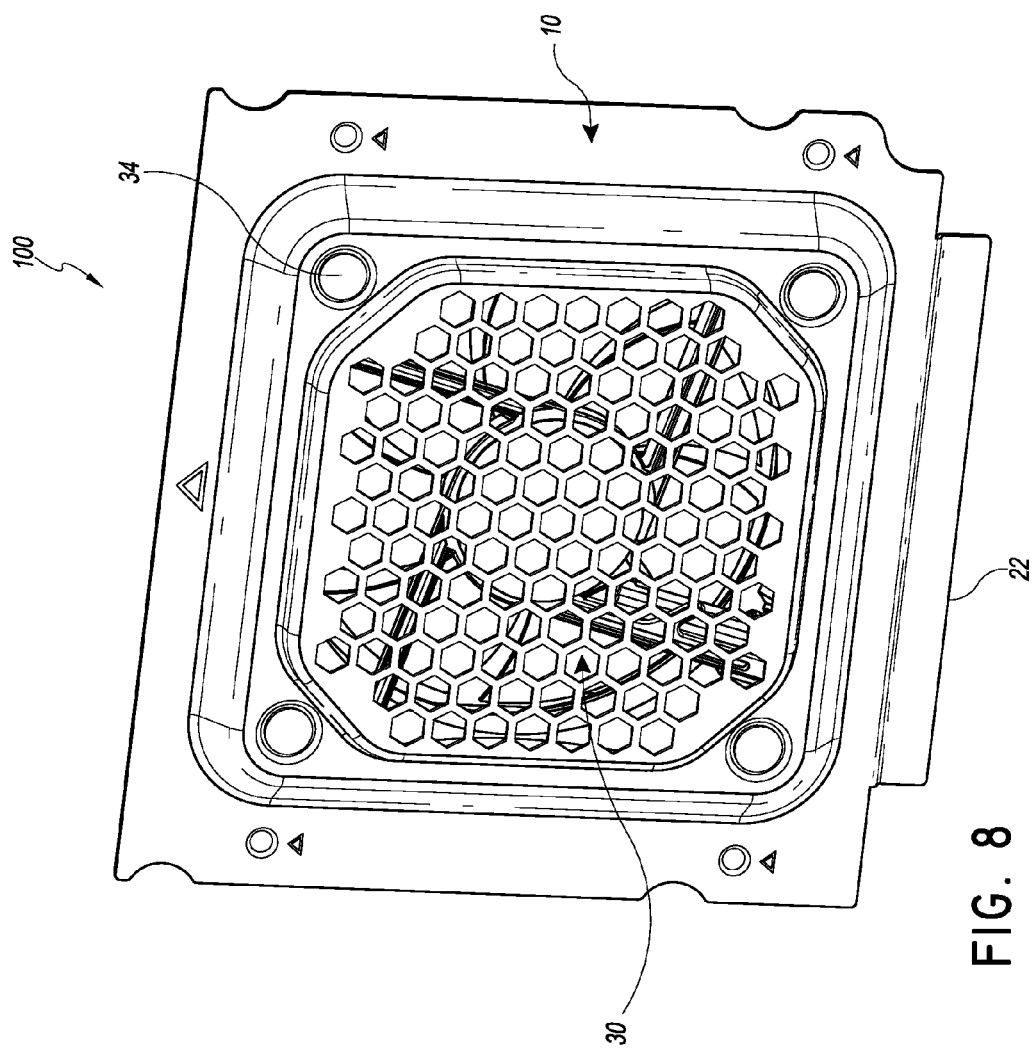
FIG. 8 shows the fan plate system in an assembled condition.

Standard computer fans have cases that are square, like that shown in the fan 30 of FIG. 7. Standard sizes for the sides are 80 mm, 92 mm, 120 mm, 140 mm or 200 mm. Of course, any sized fan 30 can be used with a fan plate 10. In some embodiments, a fan plate can be used with an 80 mm fan. The distance X (FIG. 3B) from the chassis mounting surface 2 to the first spaced surface 4 can be about: 5, 5.5, 6, 6.5, 7, 7.5, 8, 8.5, 9, 9.5 or 10 mm. The distance Y from the first spaced surface to the second spaced surface can be about: 3, 3.5, 4, 4.5, 5, 5.5, 6, 6.5, or 7 mm. In one example, the distance X is about 7.5 mm and the distance Y is about 5 mm for use with an 80 mm fan. The distances X, Y for other sized fans could be the same as the above examples or could be scaled proportionally. Other sizes can also be used.

FIG. 7 shows an exploded view of a fan plate system 100. A fan 30 can be connected to the fan plate 10 in any number of different ways. For example, one or more of fasteners, adhesives, and sonic welding could be used. In the illustrated embodiment, rubber grommets 32 and plastic fasteners 34 are used. The fasteners can be screws, snapfit, tacks, etc. The rubber grommets 32 and plastic fasteners 34 can beneficially reduce rattling and noise that may otherwise be present, such as with metal screws on a metal fan plate. FIG. 8 shows the assembled fan plate system 100.

The rubber grommets 32 can be attached to holes 36 of the fan housing 42 (FIG. 7). The fan 30 can then be placed adjacent the first spaced surface or the fan mounting surface 4. The fan holes 36 and holes in the rubber grommets 32 can be aligned with holes 28 on the fan plate 10. The fasteners 34 can then be advanced into the rubber grommets 32 from the side of the fan plate 10 opposite the fan 30. In this way, the fan 30 can be attached to the fan plate 10. In some embodiments, a fan plate system can be provided preassembled with the fan 30 and fan plate 10 connected (FIG. 8). In some embodiments, a fan plate 10 can be provided for later connection to a fan 30 if desired by the end user.

Figure 9:
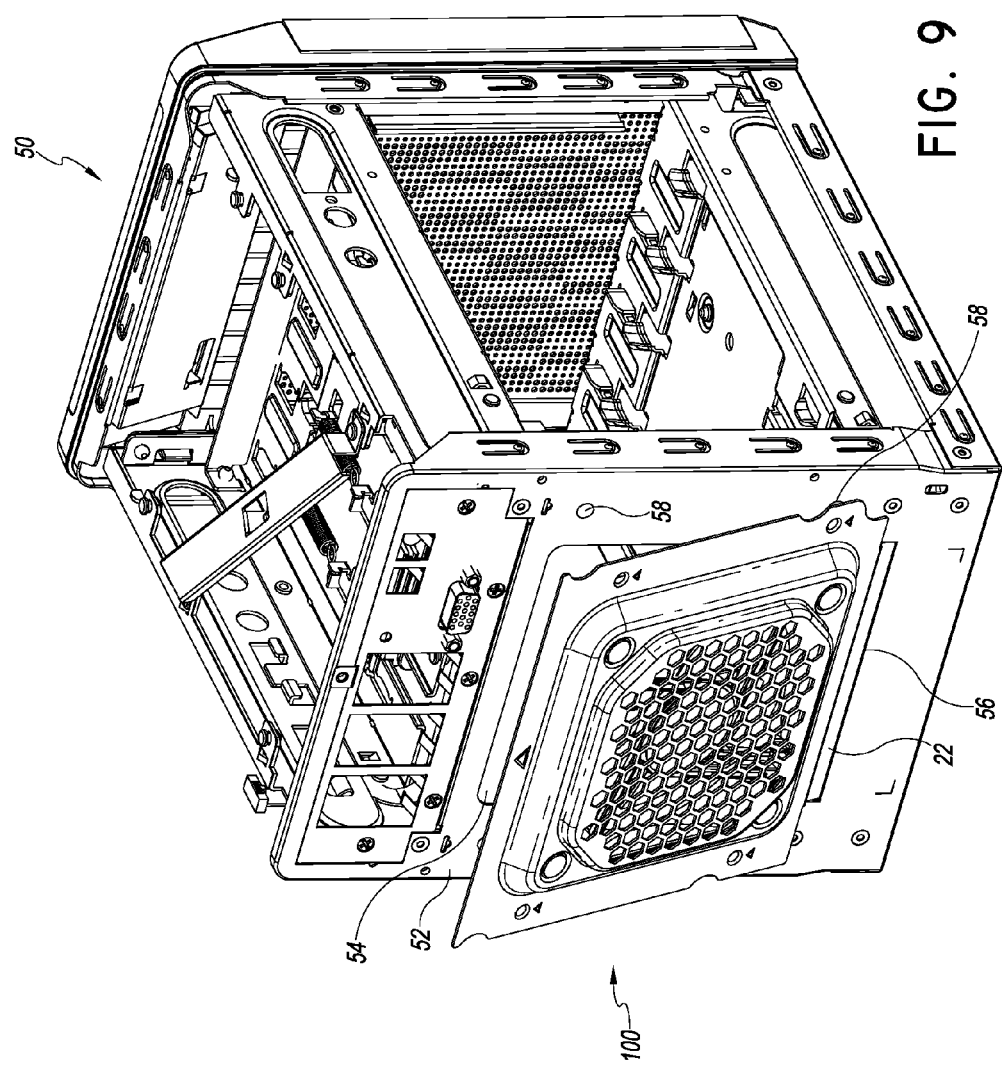
FIG. 9 shows a fan plate system being connected to a chassis.
Figure 10:
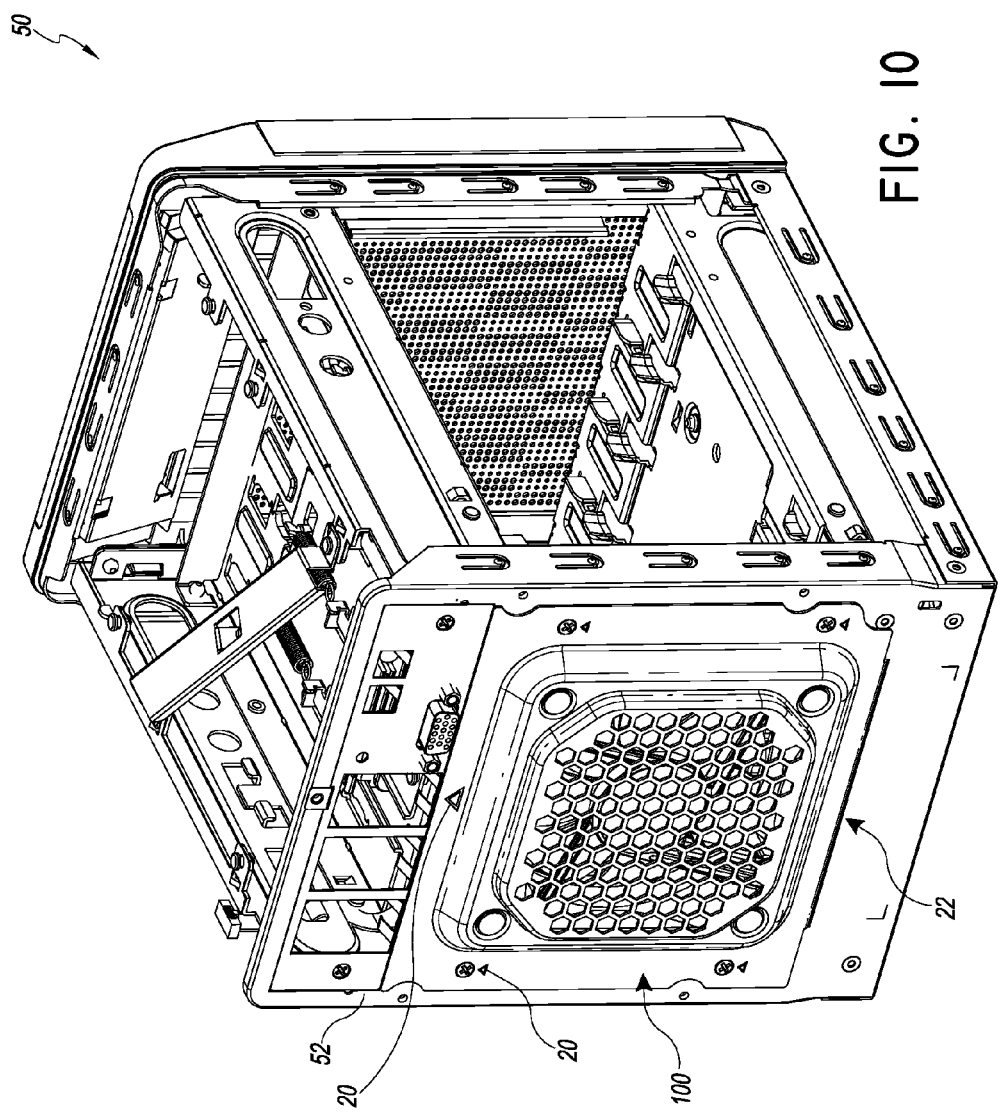
FIG. 10 illustrates the fan plate system connected to the chassis.

Moving now to FIGS. 9-10, a fan plate system 100 is shown being connected to a chassis 52 of an electronic device 50. The illustrated electronic device 50 is a server, though it will be understood that the electronic device could be any number of different devices. Examples include, but are not limited to: a computer, server, hard drive, lamp, theatrical lighting, and heater. Additional examples include a central processing unit (CPU), graphics card, chipset, hard disk, memory, etc. within a computer. The device 50 can include a chassis and/or enclosure 52 that may be open, enclosed, or at least partially enclosed. The device 50 may include features such as vents and flow channels to direct and/or control air flow to or from a fan 30 within the device, as well as outside of it.

A fan 30 can be positioned in relation to a plate 10 that can be connected to a chassis, and/or be part of a case or enclosure, such as a case for a computer. In some embodiments, the fan 30 can be connected to the plate 10. As one example, the plate can be part of a wall of a computer case which may then be a unitary piece of the case, or a separate piece connected to the larger case. In some embodiments, the fan can be connected to a chassis and then a case can enclose at least a portion of the chassis such that a portion of the case is positioned near the fan.

Returning to FIG. 9, the illustrated electronic device 50 includes a chassis 52 having a hole 54 configured for receipt of a fan 30. The hole 54 can be sized to allow a fan to extend into the hole and/or allow air flow from inside the electronic device 50 to communicate with the fan 30. In some embodiments, the hole 54 can be sized to receive a tongue 22 on a fan plate 10. The tongue 22 can be provide to allow for hinging of the fan plate 10 at the hole 54 on the chassis and to help assist in locating the plate in the proper place. The tongue 22 can extend from the chassis mounting surface 2 for aligning the fan plate 10 in the hole 54. This can for example, help ensure that screw holes 18 on the fan plate are properly aligned with screw holes 58 on the chassis.

The tongue 22 can engage with a bottom 56 of the hole 54. In some embodiments, the bottom 56 of the hole 54 can be only slightly larger than the tongue 22. Thus the hole 54 and the tongue 22 can be substantially the same width with the tongue being able to fit within the hole, to enable proper alignment of the fan plate on the chassis. The hole 54 can also be tall enough to accommodate for the thickness of the fan housing. Thus, a fan plate system 100 can be connected at the tongue 22 to the hole 54 and then pivoted into place as shown in FIGS. 9-10. As has been mentioned, a fan plate system can be provided without a fan in some embodiments.

Figure 6:
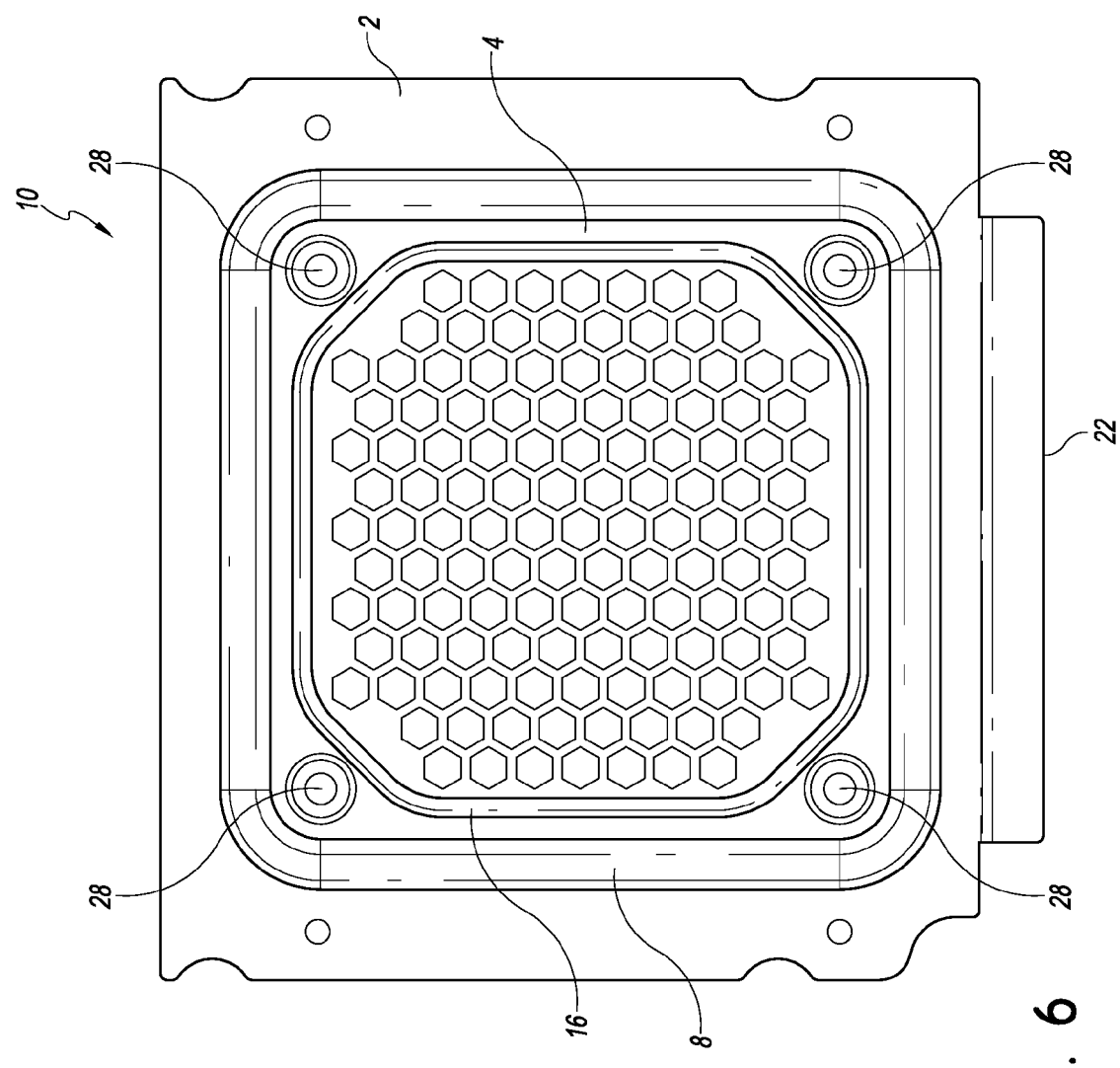
FIG. 6 is a back side view of the plate of FIG. 1.

A fan plate system can be easily swappable and replaceable. For example, a fan plate system can be easily accessible without removal of any other device components or coverings. Thus, the fan plate system can be an easily replaceable FRU (field replaceable unit). The illustrated design allows for removal by the system user without any disassembly of other areas of the device which might risk improper reassembly or other unit functionality. The fan and fan plate are an assembly that can be entirely replaced. The fan plate can be installed in the chassis and can be removed externally. As can be seen in FIG. 6, the illustrated embodiment requires only four screws to be uninstalled to remove the fan plate system. In other embodiments, four quick release pins could be used to secure the fan plate system to a chassis and/or enclosure.

A replaceable fan plate system can be provided. The system can be used for quick and easy replacement of a fan. A single fan using four push pin and receptacles can be used to pressure mount the fan against a fan mounting plate. This assembly can be used as a shippable replacement system. The plate can feature one or more thru holes for fastener installation of the plate on the chassis of the device. Other types of fasteners or connectors could also be used.

The fan plate can also include a bottom tongue type feature to position and hinge the fan plate assembly to sit flush to the chassis just prior to installation. Utilization of arrows to indicate screws and plate orientation can be also implemented for ease of installation.

A replaceable fan plate system can provide many benefits and advantages. It is generally recognized that fans are often one of the first components to fail in computers and servers. Replacement of the broken fan can return a computer or server back to working condition and can delay replacement of the entire unit. An easily replaceable fan plate system can provide for removal of the fan only with no need to remove any other components of system. This can reduce any risk to overall system functionality.

A fan plate can comprise a chassis mounting surface, a first spaced surface extending from the chassis mounting surface and configured for mounting a fan, and a second spaced surface extending from the first drawn surface, the second spaced surface comprising a grill for providing air flow.

An extended fan plate comprising a chassis mounting surface, a first drawn surface extending from the chassis mounting surface and configured for mounting a fan, and a second drawn surface extending from the first drawn surface and comprising a hole pattern for providing air flow.

A field replaceable fan assembly for an electronic device, wherein the fan assembly is configured for removal from the device without removal of any other components or enclosures of the device by removing one or more fasteners, and wherein the fan assembly comprises a "grill area" that extends outward from a surface on which the fan is mounted which is configured to form an outside surface of the electronic device.

In some embodiments, a fan plate system can comprise a fan and a fan plate. The fan can comprise a plurality of fan blades and an outer housing surrounding the plurality of fan blades. The outer housing may also define a first end of the fan having a first opening and a second end having a second opening, the first end being opposite the second end and the plurality of fan blades positioned between the first opening and the second opening. The fan can be configured such that in use the fan blades can draw air in one of the first and second openings and out the other. The fan plate can comprise a single plate having a plurality of stepped surfaces. The stepped surfaces can comprise a chassis mounting, a fan mounting surface, and a vent surface. The chassis mounting surface can be configured for mounting the fan plate system to a chassis of an electronic device. The fan mounting surface can be spaced from the chassis mounting surface, the first end of the fan outer housing being connected to the fan mounting surface. The vent surface can be spaced from both the fan mounting surface and the chassis mounting surface, such that the space between the fan mounting surface and the vent surface provides a gap between the first end of the fan outer housing and the vent surface. The vent surface can comprise a grill to allow air to flow into or from the first end of the fan through the grill.

In some embodiments, an electronic device can include a fan plate system. The electronic device can include a chassis. The chassis may include a hole for receiving a fan mounted to a fan plate, though a fan plate may be provided that does not include a fan. The fan plate system can have a tongue extending from a chassis mounting surface for aligning the fan plate in the hole in the chassis. The tongue of some embodiments extends substantially the entire length of the hole in the chassis.

In some embodiments, a fan plate defines a portion of an outer case of an electronic device.

In some embodiments, an electronic device can comprise a data storage system. The data storage system can comprise a chassis, one or more storage drives; and a fan plate system. The one or more storage drives can comprise a plurality of hard disk drives. The fan plate system can include a fan configured to cool components of the data storage system and a fan plate. The fan plate system can include any of the various different configurations described herein.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

Similarly, this method of disclosure, is not to be interpreted as reflecting an intention that any claim require more features than are expressly recited in that claim. Rather, as the following claims reflect, inventive aspects lie in a combination of fewer than all features of any single foregoing disclosed embodiment. Thus, the claims following the Detailed Description are hereby expressly incorporated into this Detailed Description, with each claim standing on its own as a separate embodiment.

What is claimed is:

1. A fan plate system comprising:
   a fan comprising:
      a plurality of fan blades; and
      an outer housing surrounding the plurality of fan blades and defining a first end of the fan having a first opening and a second end having a second opening, the first end being opposite the second end and the plurality of fan blades positioned between the first opening and the second opening, the fan configured such that in use the fan blades can draw air in one of the first and second openings and out the other; and
   a fan plate comprising a single plate having three stepped surfaces, each of the three stepped surfaces being planar, adjacent stepped surfaces having a shoulder positioned between them to create a step and to space the planar surfaces to be in separate planes, the stepped surfaces comprising:
      1) a chassis mounting surface configured for mounting the fan plate system to a chassis of an electronic device;
      2) a fan mounting surface spaced from the chassis mounting surface, the first end of the fan outer housing being connected to the fan mounting surface; and
      3) a vent surface spaced from both the fan mounting surface and the chassis mounting surface, such that a space between the fan mounting surface and the vent surface provides a gap between the first end of the fan outer housing and the vent surface, the vent surface comprising a grill to allow air to flow into or from the first end of the fan through the grill.

2. The fan plate system of claim 1, further comprising a tongue extending from the chassis mounting surface for aligning the fan plate in a hole in the chassis of the electronic device.

3. An electronic device comprising the fan plate system of claim 1 and the chassis.

4. The electronic device of claim 3, wherein the chassis comprises a hole for receiving the fan mounted to the fan plate.

5. The electronic device of 4, wherein the fan plate system further comprises a tongue extending from the chassis mounting surface for aligning the fan plate in the hole in the chassis.

6. The electronic device of 5, wherein the tongue extends substantially the entire length of the hole in the chassis.

7. A fan plate system comprising:
   a fan plate comprising:
      a first surface;
      a second surface spaced from the first surface and being in a different plane from the first surface, the second surface configured to connect to a first end of an outer housing of a fan; and
      a third surface spaced from both the first and second surfaces and being in a different plane from both the first and second surfaces, such that a space between the second surface and the third surface is configured to provide a gap between the first end of the fan outer housing and the third surface when the fan outer housing is connected to the second surface, the third surface comprising a grill configured to allow air to flow into or from the first end of the fan outer housing through the grill.

8. The fan plate system of claim 7, wherein the fan plate comprises a single plate and the first, second, and third surfaces are stepped surfaces of the single plate.

9. The fan plate system of claim 7, wherein the first, second, and third surfaces are substantially planar surfaces.

10. The fan plate system of claim 7, wherein the fan plate further comprises a first side surface connecting the first and second surfaces.

11. The fan plate system of claim 10, wherein the fan plate further comprises a second side surface connecting the second and third surfaces.

12. The fan plate system of claim 7, wherein the first surface comprises a plurality of mounting holes for fastening the fan plate to a chassis of an electronic device.

13. The fan plate system of claim 12, further comprising a tongue extending from the first surface for aligning the fan plate in a hole in the chassis of the electronic device.

14. The fan plate system of claim 7, further comprising the fan.

15. An electronic device comprising the fan plate system of claim 7, wherein the fan plate defines a portion of an outer case of the electronic device.

16. The electronic device of claim 15, further comprising a chassis, wherein the fan plate system further comprises a tongue extending from the first surface for aligning the fan plate in a hole in the chassis of the electronic device.

17. The electronic device of claim 15, further comprising one or more fasteners, wherein the fan plate system is configured for removal from the electronic device without removal of any other components or enclosures of the electronic device by removing the one or more fasteners.

18. A data storage system comprising:
a chassis;
one or more storage drives; and
a fan plate system comprising:
   a fan configured to cool components of the data storage system, the fan comprising:
   a plurality of fan blades; and
   an outer housing surrounding the plurality of fan blades and defining a first end of the fan having a first opening and a second end having a second opening, the first end being opposite the second end and the plurality of fan blades positioned between the first opening and the second opening, the fan configured such that in use the fan blades can draw air in one of the first and second openings and out the other; and
   a fan plate comprising a single plate having a plurality of three stepped surfaces, the stepped surfaces comprising:
     1) a chassis mounting surface configured for mounting the fan plate system to the chassis of the data storage system;
     2) a fan mounting surface spaced from the chassis mounting surface, the first end of the fan outer housing being connected to the fan mounting surface; and
     3) a vent surface spaced from both the fan mounting surface and the chassis mounting surface, such that a space between the fan mounting surface and the vent surface provides a gap between the first end of the fan outer housing and the vent surface, the vent surface comprising a grill to allow air to flow into or from the first end of the fan through the grill.

19. The data storage system of claim 18, wherein the chassis comprises a hole for receiving the fan mounted to the fan plate.

20. The data storage system of claim 18, wherein the one or more storage drives comprise a plurality of hard disk drives.

* * * * *